(12) United States Patent
Asada et al.

(10) Patent No.: US 6,229,251 B1
(45) Date of Patent: May 8, 2001

(54) MONOLITHIC PIEZOELECTRIC TRANSFORMER

(75) Inventors: Takaaki Asada, Moriyama; Akiteru Takatsuka, Otsu; Toshiaki Kaji, Kyoto, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/268,550

(22) Filed: Mar. 15, 1999

(30) Foreign Application Priority Data

Mar. 12, 1998 (JP) .................................. 10-061456
May 15, 1998 (JP) .................................. 10-133541

(51) Int. Cl.[7] .................................................. H01L 41/08
(52) U.S. Cl. ............................................ 310/366; 310/359
(58) Field of Search .................................... 310/358, 359, 310/366

(56) References Cited

U.S. PATENT DOCUMENTS 5,440,195 * 8/1995 Ohnishi et al. ..................... 310/359
5,463,266 * 10/1995 Fukuoka et al. ..................... 310/359
5,705,879 * 1/1998 Abe et al. .............................. 310/359
5,736,807 * 4/1998 Hakamata et al. .................... 310/359
5,751,092 * 5/1998 Abe ...................................... 310/359
5,847,490 * 12/1998 Kumasaka et al. ................... 310/348

FOREIGN PATENT DOCUMENTS 7-302938 * 11/1995 (JP) ..................................... 310/359
8-069890 * 3/1996 (JP) ..................................... 310/359
8-107241 * 4/1996 (JP) ..................................... 310/359
9-74236 * 3/1997 (JP) ..................................... 310/359
9-321362 * 10/1997 (JP) ..................................... 310/359

* cited by examiner

Primary Examiner—Mark O. Budd
(74) Attorney, Agent, or Firm—Keating & Bennett, LLP

(57) ABSTRACT

A monolithic piezoelectric transformer includes a piezoelectric substrate and input electrodes which include internal electrodes disposed in the piezoelectric substrate alternately and between piezoelectric ceramic layers and external electrodes provided on the corresponding upper and lower surfaces of the piezoelectric substrate. The length of the external electrodes is about 50% of an overall length L of the piezoelectric substrate. The length of the internal electrodes is longer than approximately 50% of the overall length L.

17 Claims, 3 Drawing Sheets

— Ai/L=0.50
— Ai/L=0.55
······ Ai/L=0.60
······ Ai/L=0.65
------ Ai/L=0.70
■■■■■ Ai/L=0.75

MONOLITHIC PIEZOELECTRIC TRANSFORMER

BACKGROUND OF THE INVENTION

1. Field of the Invention

The present invention relates to a piezoelectric transformer for use in an inverter for the backlight of a liquid crystal display, an inverter for starting a fluorescent tube, or a similar device.

2. Description of the Related Art

Conventionally, a Rosen-type piezoelectric transformer includes a rectangular, flat piezoelectric substrate, having a drive portion polarized in the thickness direction and a power generation portion polarized in the longitudinal direction. In order to achieve a reduction in size and a higher step-up voltage ratio, a monolithic piezoelectric transformer has been proposed. Piezoelectric ceramic sheets, each containing an internal electrode, are layered and fired into a single unit, thereby obtaining a monolithic piezoelectric transformer. FIG. 7 is a longitudinal sectional view of a conventional monolithic piezoelectric transformer.

The conventional piezoelectric transformer uses a primary (basic) mode or a secondary mode and includes a rectangular, flat piezoelectric substrate 1. A plurality of piezoelectric ceramic sheets 5 shown in FIG. 7 are layered and fired into a single unit, to thereby obtain the piezoelectric substrate 1. Pairs of input electrodes 21 and 22 are formed within and on the upper and lower surfaces of a longitudinal half portion (left-side half in FIG. 7) of the piezoelectric substrate 1 such that the input electrodes 21 and 22 face each other and extend over substantially the entire area of the longitudinal half portion of the substrate 1. An output electrode 3 is formed on the longitudinal end surface of the other longitudinal half portion of the substrate 1. The half portion including the input electrodes 21 and 22 functions as a drive portion A and is polarized in the thickness direction of the substrate. The other half portion including the output electrode 3 functions as a power generation portion B and is polarized longitudinally.

The input electrode 21 includes internal electrodes 21i formed within the piezoelectric substrate 1 and an external electrode 21e formed on the upper surface of the piezoelectric substrate 1 (as viewed in FIG. 7). The input electrode 22 includes internal electrodes 22i formed within the piezoelectric substrate 1 and an external electrode 22e formed on the lower surface of the piezoelectric substrate 1 (as viewed in FIG. 7). The electrodes 21i and 22i are formed alternately and between piezoelectric ceramic layers. The internal electrodes 21i and 22i have a length that is equal to that of the external electrodes 21e and 22e. The internal electrodes 21i are connected in common to the external electrode 21e, and the internal electrodes 22i are connected in common to the external electrode 22e.

An input line is connected to the input electrodes 21 and 22 at the node point thereof, whereas an output line is connected to the output electrode 3. An input voltage is applied to the piezoelectric transformer 1 through the input line and is stepped up by the piezoelectric effect and the reverse piezoelectric effect. The stepped-up voltage is obtained from the output electrode 3 through the output line.

A piezoelectric transformer having the above-described structure is used in a starting circuit for a cold-cathode tube serving as a backlight for a liquid crystal display. Light quality of the cold-cathode tube is adjusted by varying the output voltage of the piezoelectric transformer. The piezoelectric transformer is required to output a stable output voltage even when the input voltage varies. Usually, the output voltage is adjusted or regulated by varying a drive frequency for the piezoelectric transformer. Conventionally, the longitudinal dimension or length of the input electrodes (the length of the drive portion) is made longer than half the length of the piezoelectric substrate so as to make the frequency characteristic of a step-up ratio steep, thereby obtaining a desired output voltage without impairing efficiency. Such a piezoelectric transformer is proposed in, for example, Japanese Patent Application Laid-Open (kokai) No. 9-21362.

According to the above-described conventional monolithic piezoelectric transformer, the internal and external electrodes, which constitute the input electrodes, have the same length. Whenever the conditions of the step-up ratio and efficiency are to be modified by altering the length ratio between the drive portion and the power generation portion, jigs and tools for forming the external electrodes must be manufactured accordingly. Such jigs and tools include a screen mask for printing and a metallic mask for vapor deposition. Also, electrode patterns formed on a substrate on which the piezoelectric transformer is mounted must be modified accordingly.

SUMMARY OF THE INVENTION

In order to overcome the problems described above, preferred embodiments of the present invention provide a monolithic piezoelectric transformer which achieves excellent characteristics by arranging the length of internal electrodes to be greater than the length of the external electrodes and enabling common use of jigs and tools for formation of the external electrodes and common use of mounting substrates.

To achieve the above object, one preferred embodiment of the present invention provides a monolithic piezoelectric transformer including a piezoelectric substrate having a laminated body made of a plurality of piezoelectric ceramic members, the piezoelectric substrate including a drive portion and a power generation portion which are arranged adjacent to each other in the longitudinal direction of the piezoelectric substrate, the drive portion being polarized in the thickness direction of the piezoelectric substrate and further including an input electrode which has internal electrodes provided in the drive portion and external electrodes provided on a surface of the drive portion, and the power generation portion being polarized in the longitudinal direction of the piezoelectric substrate and further having an output electrode associated with the power generation, wherein a length of the external electrodes is different from that of the internal electrodes.

According to the above described structure and arrangement, excellent characteristics are achieved by modifying the length of the internal electrodes while holding the length of the external electrodes constant. This enables common use of jigs and tools during formation of the external electrodes and common use of mounting substrates. More specifically, when piezoelectric transformers of the same size and different characteristics are to be manufactured, common and standard jigs and tools for formation of the external electrodes and mounting substrates can be used for all components, since the external electrodes can be made to have a predetermined length. Therefore, the manufacturing cost and the mounting cost can be reduced.

Preferably, the length of the internal electrodes is at least approximately 50% that of the piezoelectric substrate but less than the full length of the piezoelectric substrate.

According to the above described structure and arrangement, the length of the effective drive portion becomes longer than that of the power generation portion, thereby obtaining a steeper frequency characteristic of step-up ratio. Thus, a desired output voltage can be obtained through a slight adjustment of driving frequency such that efficiency does not decrease.

Preferably, the length of the internal electrodes is about 55% to about 70% that of the piezoelectric substrate.

According to the above described structure and arrangement, the output voltage can be adjusted easily, and the piezoelectric transformer operates stably.

Other features and advantages of the present invention will become apparent from the following description of the invention which refers to the accompanying drawings.

DETAILED DESCRIPTION OF PREFERRED EMBODIMENTS

Figure 1:
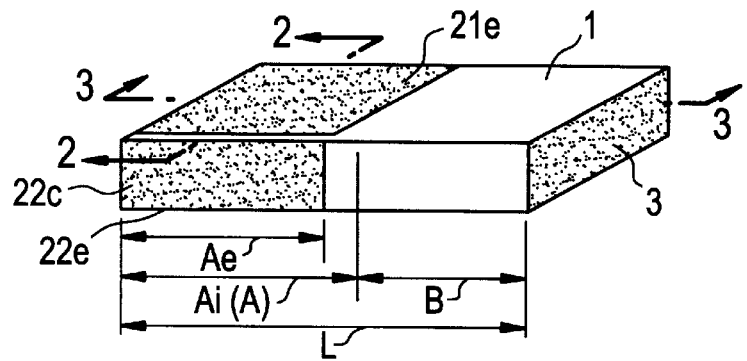
FIG. 1 is a perspective view of a monolithic piezoelectric transformer according to one preferred embodiment of the present invention.
Figure 2:
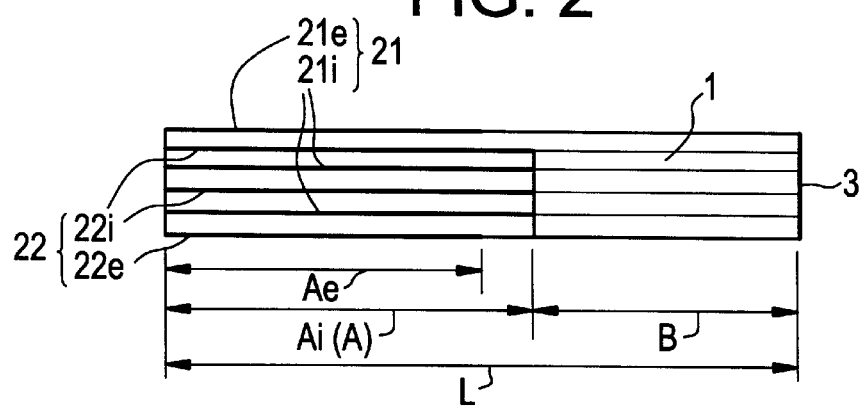
FIG. 2 is a longitudinal sectional view taken along line X—X of FIG. 1.
Figure 3:
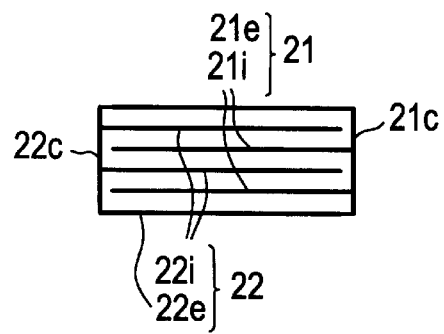
FIG. 3 is a transverse sectional view taken along line Y—Y of FIG. 1.

A monolithic piezoelectric transformer according to one preferred embodiment uses a primary or secondary vibration mode. A piezoelectric substrate 1 is formed by the steps of laminating a plurality of piezoelectric ceramic green sheets 5 in FIG. 2 and firing the layered body. An input electrode 21 includes internal electrodes 21$i$ and an external electrode 21$e$, and an input electrode 22 includes internal electrodes 22$i$ and an external electrode 22$e$. The internal electrodes 21$i$ and 22$i$ are arranged in the piezoelectric substrate 1 alternately and between the piezoelectric ceramic layers. As shown in FIG. 2, the external electrodes 21$e$ and 22$e$ are disposed on the upper and lower surfaces, respectively, of the piezoelectric substrate 1. As shown in FIG. 3, the internal electrodes 21$i$ are connected to the external electrode 21$e$ via a connection electrode 21$c$ disposed on a side surface of the piezoelectric substrate 1, whereas the internal electrodes 22$i$ are connected to the external electrode 22$e$ via a connection electrode 22$c$ disposed on the other side surface of the piezoelectric substrate 1.

The external electrodes 21$e$ and 22$e$ are constructed to have a length that is approximately 50% of the overall length L of the piezoelectric substrate 1. The internal electrodes 21$i$ and 22$i$ extend from a longitudinal end of the piezoelectric substrate 1 to a position located beyond the longitudinal center of the piezoelectric substrate 1, i.e., the electrodes 21$e$, 22$e$ have a length greater than approximately 50% of the overall length L (about 60% of the overall length L in FIG. 2). An output electrode 3 is provided on the other longitudinal end surface of the piezoelectric substrate 1.

A portion of the piezoelectric substrate 1 where the input electrodes 21 and 22 are formed is polarized in the thickness direction of the piezoelectric substrate 1 and functions as a drive portion A, whereas the other portion of the piezoelectric substrate 1 is longitudinally polarized and functions as a power generation portion B. The portion of the piezoelectric substrate 1 corresponding to a length Ai of the internal electrodes 21$i$ and 22$i$ functions as the effective drive portion A. That is, in the monolithic piezoelectric transformer according to the present preferred embodiment, a length Ae of the external electrodes is made different from the length Ai of the internal electrodes. By virtue of this feature, the length of the effective drive portion A is made longer than that of the power generation portion B simply by modifying the length Ai of the internal electrodes while the length Ae of the external electrodes is held constant. Accordingly, the length Ae of the external electrodes is determined so as to correspond to the shape of a standardized screen mask as well as an electrode pattern formed on a substrate on which the piezoelectric transformer is to be mounted. The length Ai of the internal electrodes is determined so as to obtain a desired electric characteristic.

Next will be described the characteristics of step-up ratio and efficiency as observed when the length of the internal electrodes is varied while the length of the external electrodes is held constant (Ae/L=0.50), with reference to FIGS. 4 to 6.

Figure 4:
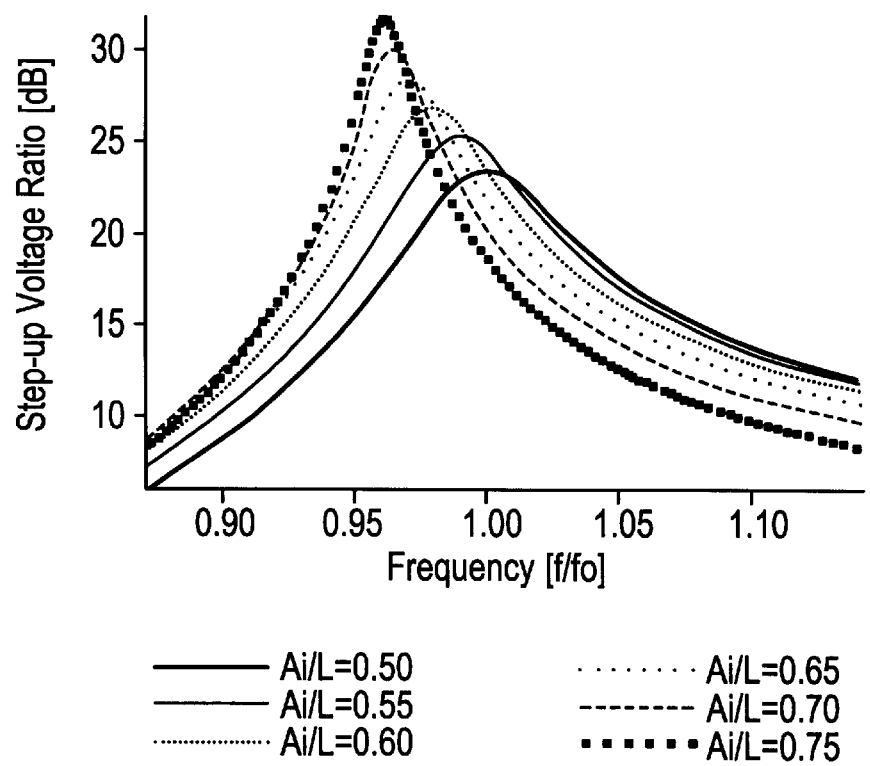
FIG. 4 is a graph showing the frequency characteristic of a step-up ratio.
Figure 5:
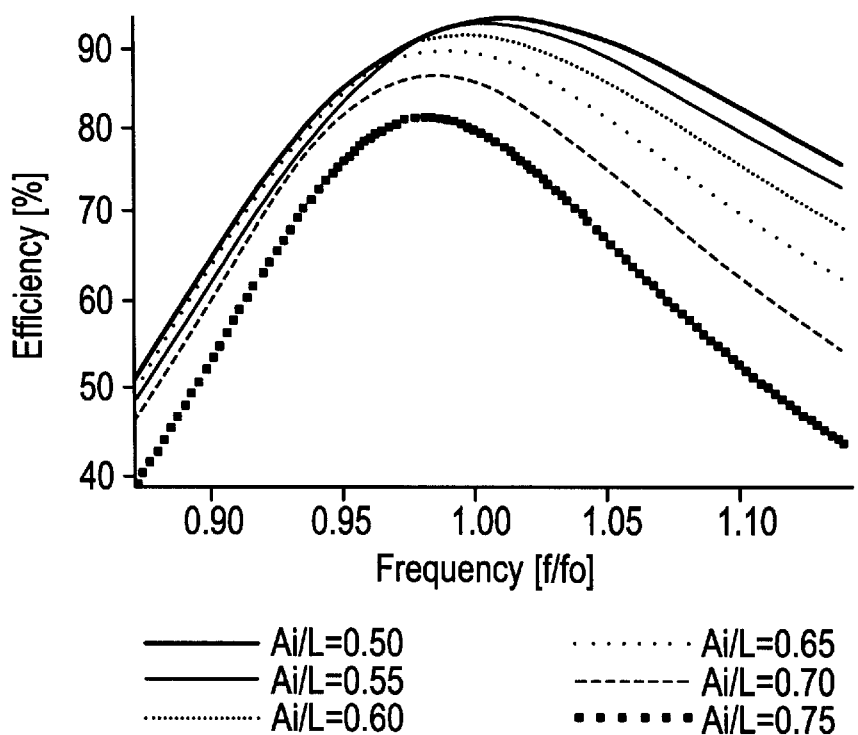
FIG. 5 is a graph showing the frequency characteristic of efficiency.

FIGS. 4 and 5 show variations of step-up ratio and efficiency as observed when a piezoelectric transformer, having a piezoelectric substrate with the approximate dimensions of 6.0 mm (width)×22.0 mm (length)×1.8 mm (thickness) and having a 7-layer structure (6 internal electrodes), is operated such that driving frequency is varied at a load resistance RL of 50 kΩ. In FIGS. 4 and 5, "frequency" is normalized with respect to the frequency $f_0$ (about 85 kHz) which maximizes the step-up ratio for Ai/L=0.50.

As shown in FIGS. 4 and 5, by modifying the length of the internal electrodes while the length of the external electrodes is held constant, the maximum value of the step-up ratio and the slope of the step-up ratio in relation to frequency (frequency characteristic) can be adjusted. As the length of the internal electrodes increases, the maximum value of the step-up ratio increases, the frequency characteristic of the step-up ratio becomes steeper, and the maximum value of efficiency decreases.

Applying this structure to a starting circuit for a cold-cathode tube, in order to adjust the output voltage or obtain a stable output voltage even upon variation in input voltage, output must be reduced such that an operating step-up ratio becomes slightly lower than the maximum step-up ratio. As compared to an electromagnetic transformer, it is very advantageous to use the piezoelectric transformer when the piezoelectric transformer exhibits an efficiency of not less than about 85%. Also, since a higher efficiency is observed at a frequency higher than that which maximizes the step-up ratio, the piezoelectric transformer is usually operated at a frequency higher than that which maximizes the step-up ratio. When the maximum step-up ratio is to be adjusted while the slope of the step-up ratio in relation to frequency is held constant, the number of internal electrodes, i.e., the number of layers may be modified.

Figure 6:
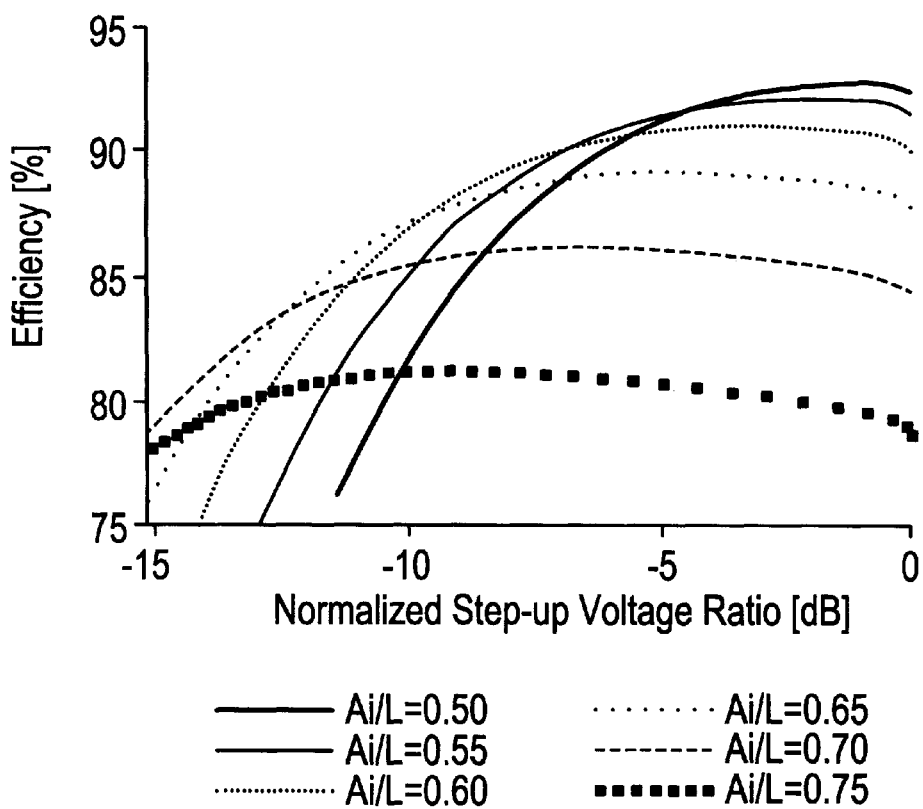
FIG. 6 is a graph showing the relationship between step-up ratio and efficiency.
Figure 7:
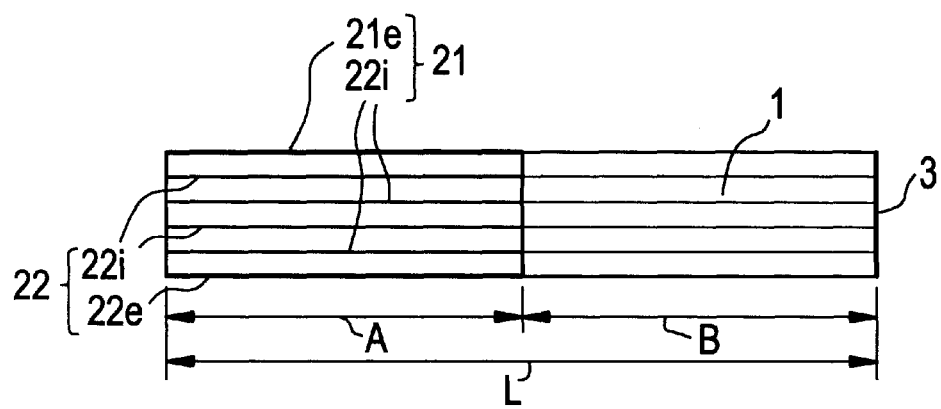
FIG. 7 is a longitudinal sectional view of a conventional monolithic piezoelectric transformer.

FIG. 6 shows the relationship between step-up ratio and efficiency. In FIG. 6, the step-up ratio is normalized with respect to the maximum step-up ratio which is shown for each Ai/L in FIG. 4. Notably, the characteristic of FIG. 6 is at a frequency higher than that which maximizes the step-up ratio.

As shown in FIG. 6, at a normalized step-up ratio of 0 dB (i.e., at a maximum output voltage), as the length Ai of the internal electrodes increases, efficiency decreases. At a normalized step-up ratio of −10 dB, efficiencies for Ai/L= 0.55–0.70 are higher than that for Ai/L=0.50; however, efficiency for Ai/L=0.75 is lower than that for Ai/L=0.50. Further, at a normalized step-up ratio of 0 dB to −10 dB, which corresponds to the aforementioned operating step-up ratio range, efficiency for Ai/L=0.75 is significantly lower than those for Ai/L=0.50–0.70, i.e., efficiency for Ai/L=0.75 is below about 85%. Thus, the monolithic piezoelectric transformer having a ratio Ai/L of 0.75 is not practically usable.

As described above, as the length Ai of the internal electrodes increases beyond half the length L of the piezoelectric substrate, the frequency characteristic of the step-up ratio becomes steeper. Accordingly, when the driving frequency is varied by a certain amount, the amount of variation in output voltage becomes greater. Conversely, when the output voltage is to be varied or adjusted by a certain amount, the amount of variation in driving frequency can be reduced through increase in the length of the internal electrodes, so that the output voltage can be adjusted while any effect on efficiency is limited to a negligible amount. In order to achieve this favorable effect by making the frequency characteristic of the step-up ratio steeper, the ratio of the length of the internal electrodes relative to the overall length of the piezoelectric substrate, Ai/L, is preferably at least about 0.55. In order to maintain efficiency at a favorable level, the ratio Ai/L is preferably not greater than about 0.70. Thus, in order to facilitate adjustment of the output voltage and obtain stable operation, the length of the internal electrodes is preferably about 55% to about 70% of the overall length of the piezoelectric substrate.

The characteristics of FIGS. 4 to 6 are of monolithic piezoelectric transformers having external electrodes with a length that is about 50% of the overall length of the piezoelectric substrate. However, it has been confirmed that substantially similar characteristics are achieved for different lengths of the external electrodes. That is, the length of the external electrodes is determined from the viewpoint of improvement in manufacturing efficiency and mounting efficiency, whereas the length of the internal electrodes is determined from the viewpoint of improvement in electrical characteristics (step-up ratio and efficiency).

The present invention is not to be limited to the above-described preferred embodiments, but may be modified within the scope of the appended claims. For example, the connection electrodes 21*c* and 22*c* are intended to connect the internal electrodes and the external electrodes, and their length and shape are not particularly limited.

While the invention has been particularly shown and described with reference to preferred embodiments thereof, it will be understood by those skilled in the art that the forgoing and other changes in form and details may be made therein without departing from the spirit of the invention.

What is claimed is:

1. A monolithic piezoelectric transformer, comprising:
 a piezoelectric substrate having a laminated body including a plurality of piezoelectric ceramic members, said piezoelectric substrate including a drive portion and a power generation portion which are arranged adjacent to each other in the longitudinal direction of said piezoelectric substrate;
 said drive portion being polarized in the thickness direction of said piezoelectric substrate and including an input electrode, said input electrode including internal electrodes provided in said drive portion and external electrodes provided on a top and bottom surface of said drive portion such that said internal and external electrodes extend in the longitudinal direction of said piezoelectric substrate; and
 said power generation portion being polarized in the longitudinal direction of said piezoelectric substrate and including an output electrode associated with said power generation;
 wherein the length of the external electrodes in the longitudinal direction of the piezoelectric substrate is different from that of the internal electrodes and the length of said internal electrodes is about 55% to about 70% of the length of said piezoelectric substrate, and the lengths of said internal electrodes are substantially parallel to the lengths of said external electrodes.

2. The monolithic piezoelectric transformer according to claim 1, wherein the length of the internal electrodes is greater than the length of the external electrodes and less than the length of the piezoelectric substrate.

3. The monolithic piezoelectric transformer according to claim 1, wherein the length of the internal electrodes is at least about 50% of the length of said piezoelectric substrate.

4. The monolithic piezoelectric transformer according to claim 1, wherein the internal electrodes are arranged in the piezoelectric substrate alternate and between the piezoelectric ceramic members.

5. The monolithic piezoelectric transformer according to claim 1, wherein the internal electrodes extend from a longitudinal end of the piezoelectric substrate to a position located beyond a longitudinal center of the piezoelectric substrate.

6. The monolithic piezoelectric transformer according to claim 1, wherein the length of the internal electrodes is about 60% of the length of said piezoelectric substrate.

7. The monolithic piezoelectric transformer according to claim 1, wherein a portion of the piezoelectric substrate corresponding to a length of the internal electrodes functions as an effective drive portion.

8. The monolithic piezoelectric transformer according to claim 1, wherein the length of the effective drive portion is greater than the length of the power generation portion.

9. A monolithic piezoelectric transformer, comprising:
 a piezoelectric substrate having a laminated body including a plurality of piezoelectric ceramic member, said piezoelectric substrate including a drive portion and a power generation portion which are arranged adjacent to each other in the longitudinal direction of said piezoelectric substrate;
 said drive portion being polarized in the the thickness direction of said piezoelectric substrate and including an input electrode, said input electrode including internal electrodes provided in said drive portion and external electrodes provided on a top and bottom surface of said drive portion such that said internal and external electrodes extend in the longitudinal direction of said piezoelectric substrate; and
 said power generation portion being polarized in the longitudinal direction of said piezoelectric substrate and including an output electrodes associated with said power generation;
 wherein a dimension of the external electrodes and a dimension of the internal electrodes are different from each other and the length of said internal electrodes is about 55% to about 70% of the length of said piezoelectric substrate, and the length of said internal electrodes are substantially parallel to the length of said external electrodes.

10. The monolithic piezoelectric transformer according to claim 9, wherein the length of the internal electrodes is greater than the length of the external electrodes.

11. The monolithic piezoelectric transformer according to claim 9, wherein the length of the internal electrodes is less than the length of the piezoelectric substrate.

12. The monolithic piezoelectric transformer according to claim 9, wherein the length of the internal electrodes is at least about 50% of the length of said piezoelectric substrate.

13. The monolithic piezoelectric transformer according to claim 9, wherein the internal electrodes are arranged in the piezoelectric substrate alternately and between the piezoelectric ceramic members.

14. The monolithic piezoelectric transformer according to claim 9, wherein the internal electrodes extend from a longitudinal end of the piezoelectric substrate to a position located beyond a longitudinal center of the piezoelectric substrate.

15. The monolithic piezoelectric transformer according to claim 9, wherein the length of the internal electrodes is about 60% of the length of said piezoelectric substrate.

16. The monolithic piezoelectric transformer according to claim 9, wherein a portion of the piezoelectric substrate corresponding to a length of the internal electrodes functions as an effective drive portion.

17. The monolithic piezoelectric transformer according to claim 9, wherein the length of the effective drive portion is greater than the length of the power generation portion.

* * * * *